United States Patent [19]

Chiu

[11] Patent Number: 4,490,900
[45] Date of Patent: Jan. 1, 1985

[54] METHOD OF FABRICATING AN MOS MEMORY ARRAY HAVING ELECTRICALLY-PROGRAMMABLE AND ELECTRICALLY-ERASABLE STORAGE DEVICES INCORPORATED THEREIN

[75] Inventor: Te-Long Chiu, San Jose, Calif.

[73] Assignee: SEEQ Technology, Inc., San Jose, Calif.

[21] Appl. No.: 343,845

[22] Filed: Jan. 29, 1982

[51] Int. Cl.³ .................. H01L 21/26; H01L 29/78
[52] U.S. Cl. .................. 29/571; 29/576 W;
29/578; 148/1.5; 148/187; 148/188; 427/93;
357/24
[58] Field of Search ............. 29/571, 576 B, 576 W,
29/578, 577 R, 571 C; 148/1.5, 187, 188;
427/93, 94; 357/22, 24, 41, 59

[56] References Cited

U.S. PATENT DOCUMENTS

| 3,868,187 | 2/1975 | Masuoka | 357/23 |
|---|---|---|---|
| 3,919,711 | 11/1975 | Chou | 357/23 |
| 3,924,024 | 12/1975 | Naber et al. | 427/94 X |
| 4,011,576 | 3/1977 | Uchida et al. | 357/23 |
| 4,016,588 | 4/1977 | Ohya et al. | 357/23 |
| 4,019,197 | 4/1977 | Lohstroh et al. | 357/23 |
| 4,115,914 | 9/1978 | Harari | 29/571 |
| 4,203,158 | 5/1980 | Frohman-Bentchkowsky | 357/41 X |
| 4,282,270 | 8/1981 | Nozaki et al. | 427/94 X |
| 4,373,249 | 2/1983 | Kosa et al. | 29/577 C X |

FOREIGN PATENT DOCUMENTS

| 5232359 | 7/1974 | Japan | 357/23 |

OTHER PUBLICATIONS

Takashi Ito, et al., "Retardation of Destructive Breakdown of SiO₂ Films Annealed in Ammonia Gas", *J. Electrochem. Soc.: Solid-State Science and Technology*, Oct. 1980, pp. 2248-2251.
Michael F. Leahy, "Directional Plasma Etching of Polysilicon in a CF₃Cl Discharge", The Electrochemical Society, *Extended Abstracts*, Abstract No. 271, Oct. 1981, pp. 660-661.
Hideo Sunami, et al., "Characteristics of a Buried Channel, Graded Drain with Punch-Through Stopper (BGP) MOS Device", IEEE Electron Devices Soc., 1981 Symposium on VLSI Technology, Sep. 1981.

*Primary Examiner*—Brian E. Hearn
*Assistant Examiner*—David A. Hey
*Attorney, Agent, or Firm*—Lyon & Lyon

[57] ABSTRACT

A method for fabricating an MOS memory array is disclosed, wherein the method includes steps for constructing electrically-programmable and electrically-erasable memory cells (2, 198, 200) in combination with assorted peripheral devices (202, 204, 206) on a semiconductor substrate (8, 71). Tunneling regions (20, 78) are formed in the substrate (8, 71) and thin tunnel dielectrics (22, 84) comprised of silicon dioxide/oxynitride material are grown over the tunneling regions (20, 78) to facilitate transport of charge carriers between the tunneling regions (20, 78) and subsequently-fashioned floating gate structures (14R, 14L, 156) in the memory cells (2, 198, 200). A first layer of doped polycrystalline silicon is then deposited over the substrate and etched to define large polysilicon areas. An oxide layer is grown over the large polysilicon areas in a manner such that out-diffusion of the impurity present in the large polysilicon areas is prevented. Thereafter, a second layer of doped polycrystalline silicon is deposited over the substrate and etched together with the large polysilicon areas to define the memory cell floating gate structures (14R, 14L, 156) as well as various memory cell program and control gates (16R, 16L, 40R, 40L, 128, 132) and peripheral device control gates (136, 138). Source and drain regions (34, 36, 58, 60, 64, 66, 168-179) for the memory cells (2, 198, 200) and the peripheral devices (202, 204, 206) are established by implanting an impurity in the semiconductor substrate (8, 71), using the memory cell program and control gates (16R, 16L, 40R, 40L, 128, 132) and the peripheral device control gates (136, 138) for alignment. Protective coverings of refill oxide (188) and VapOx (190) are formed over the substrate to complete the fabrication process.

11 Claims, 46 Drawing Figures

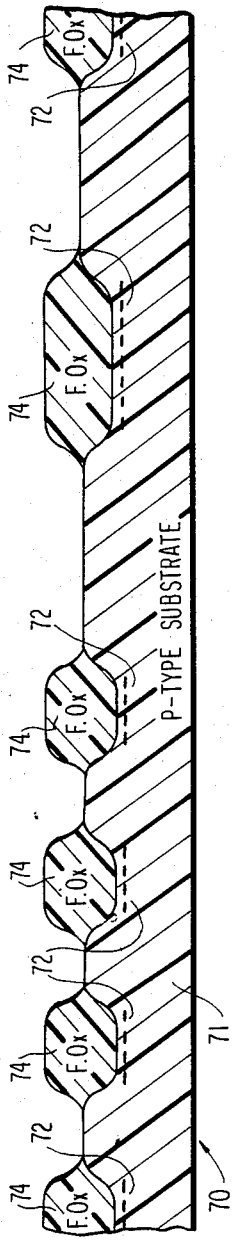
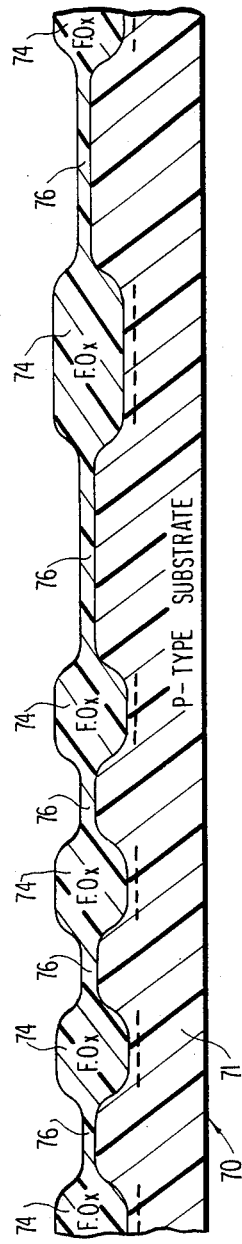
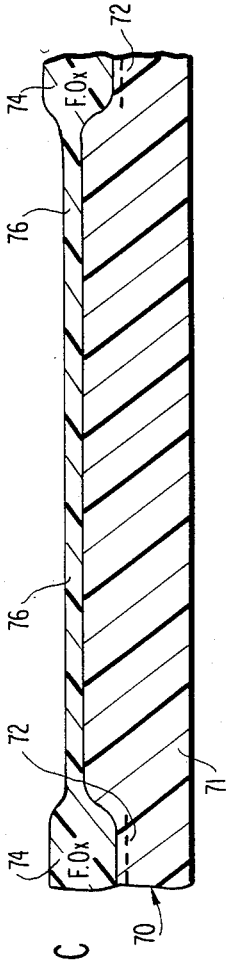
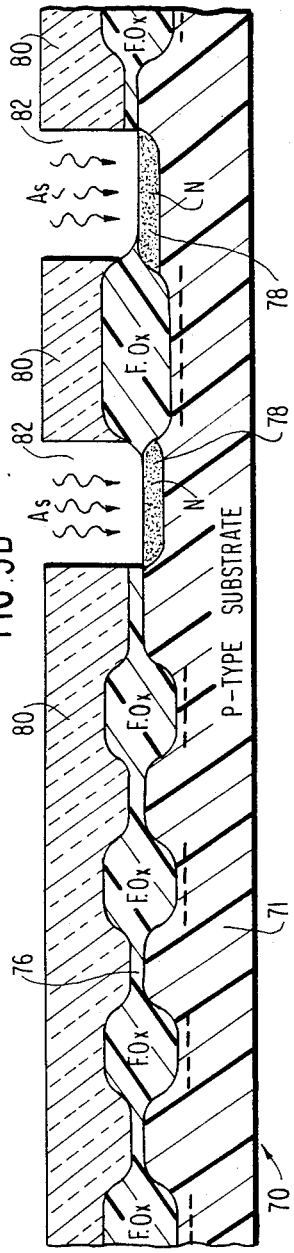

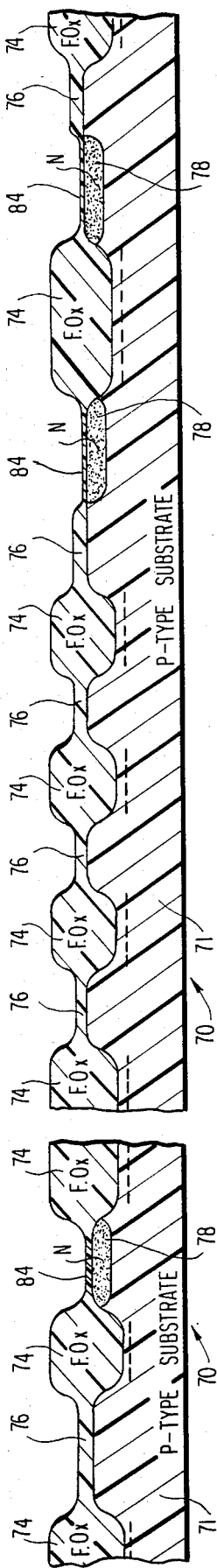
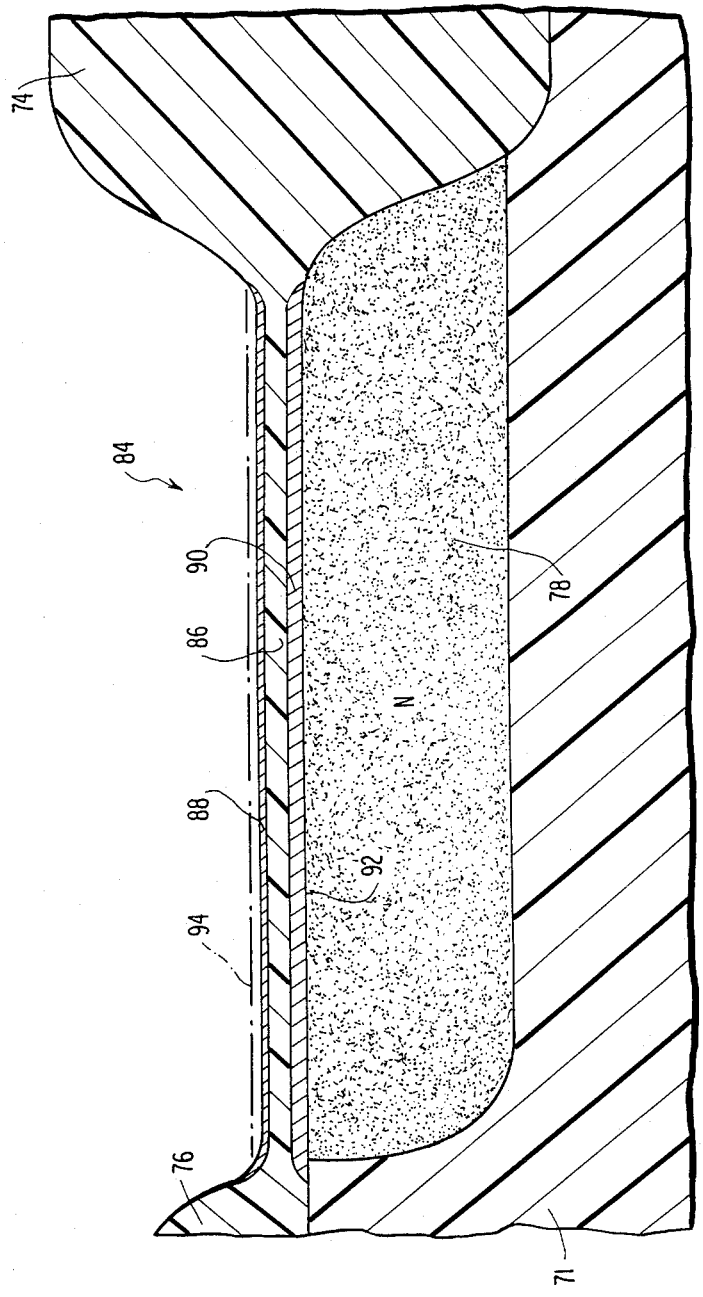
FIG. 6A
FIG. 6B
FIG. 7

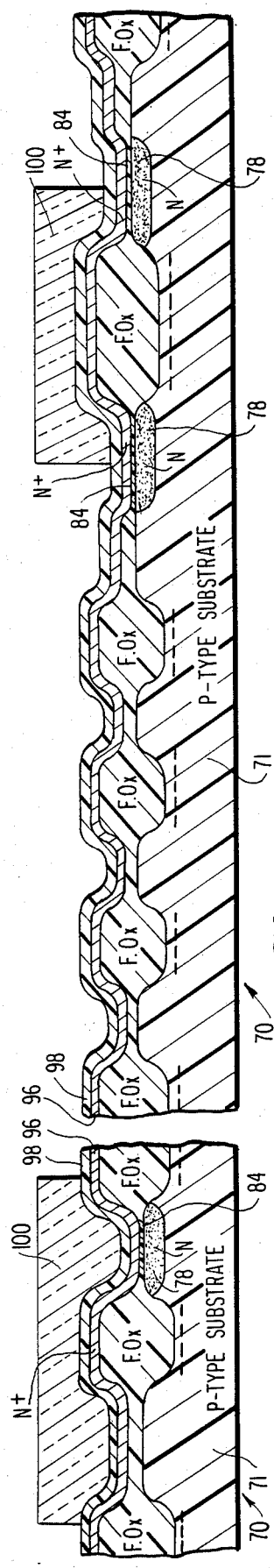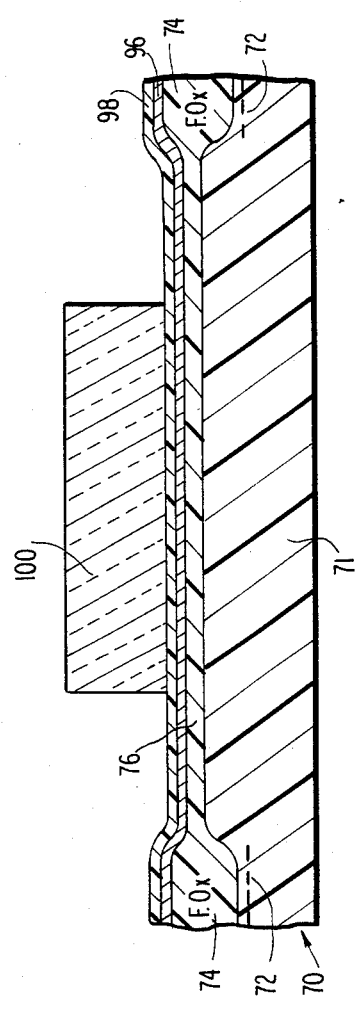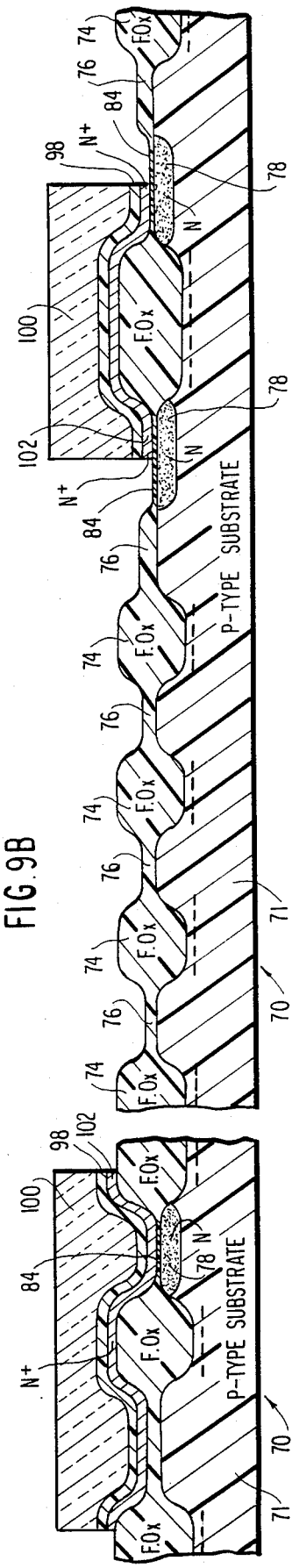

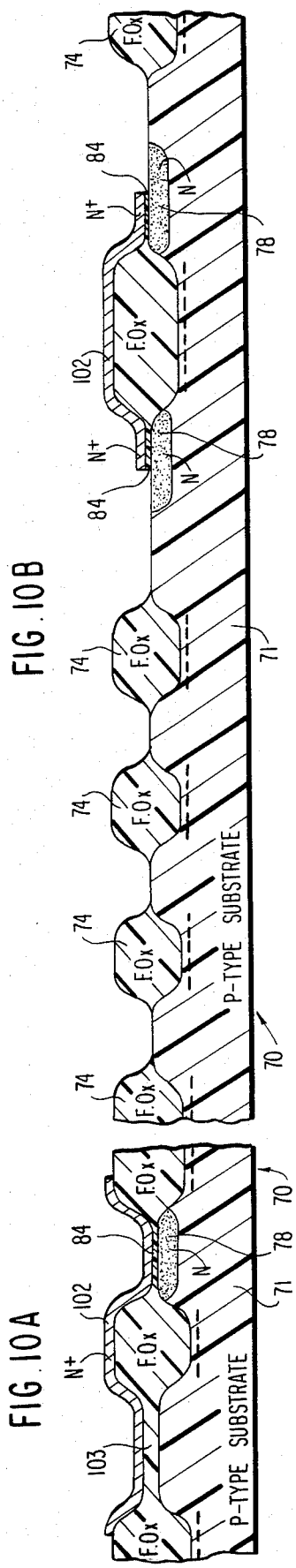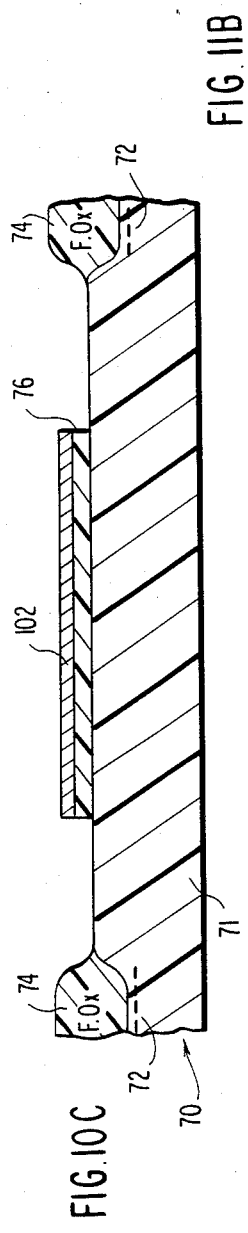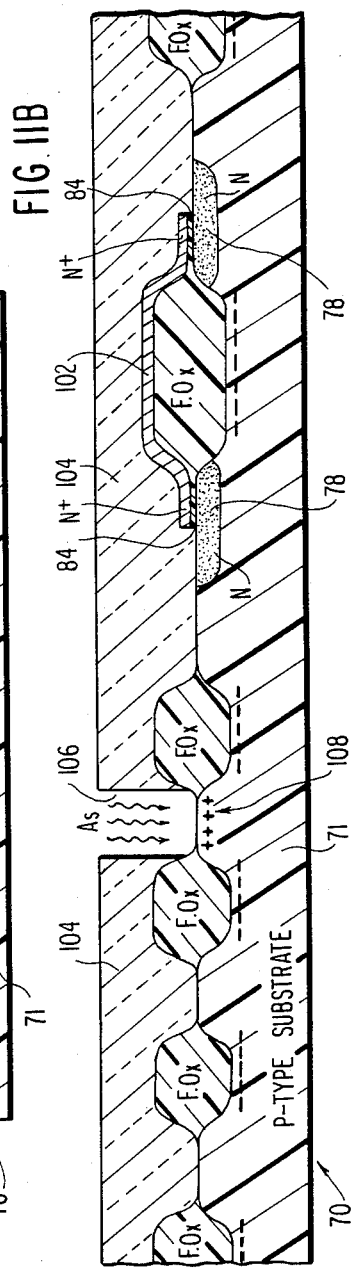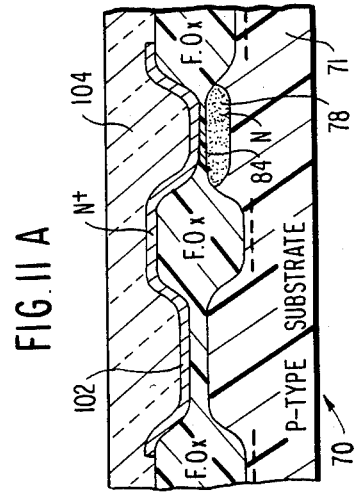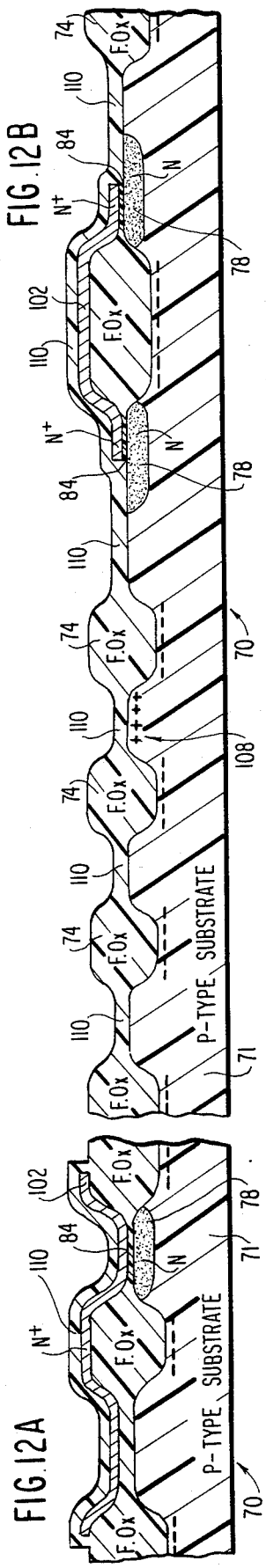

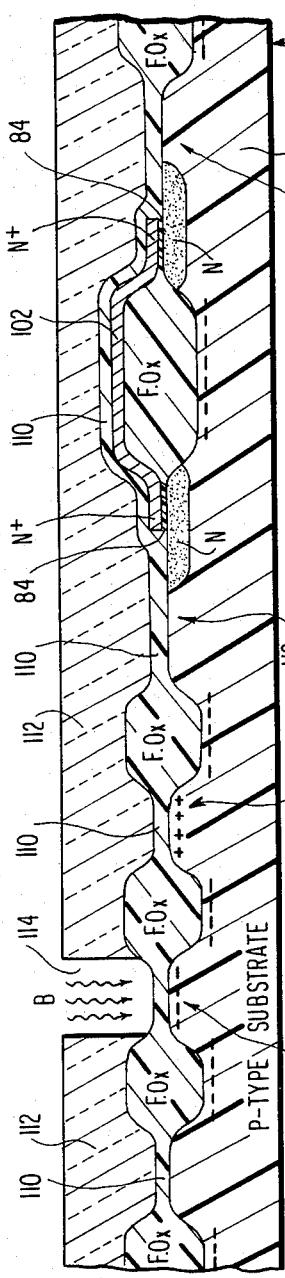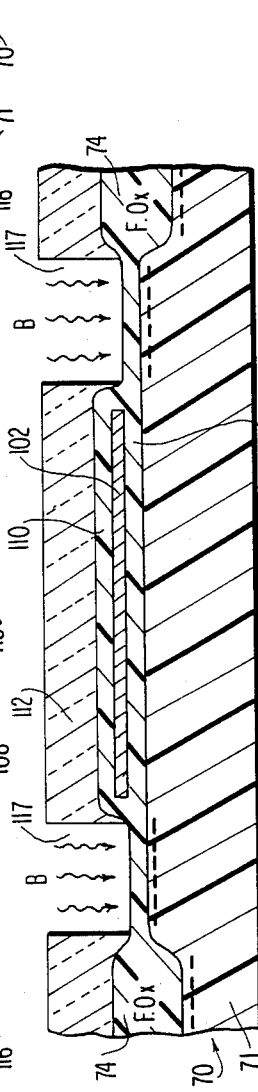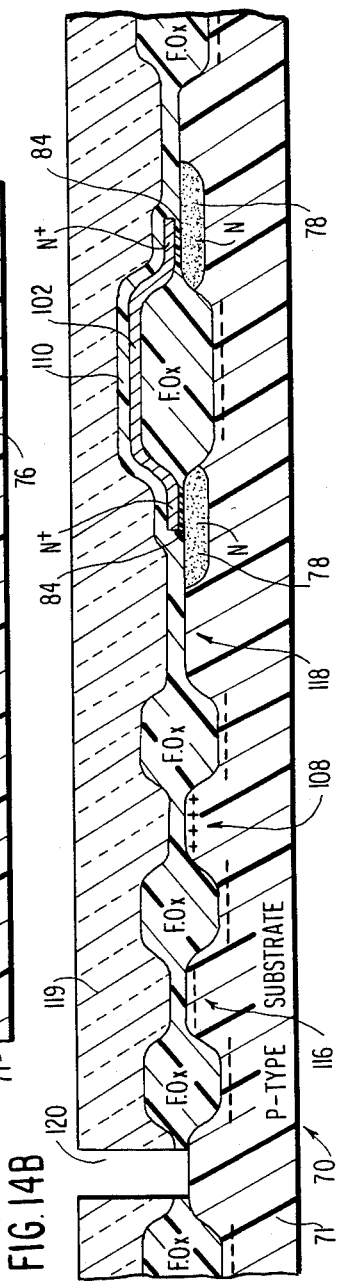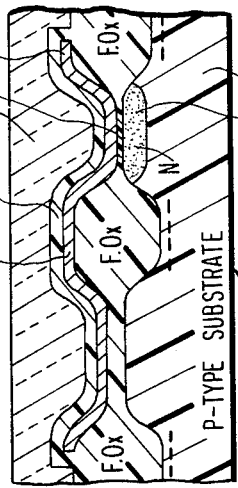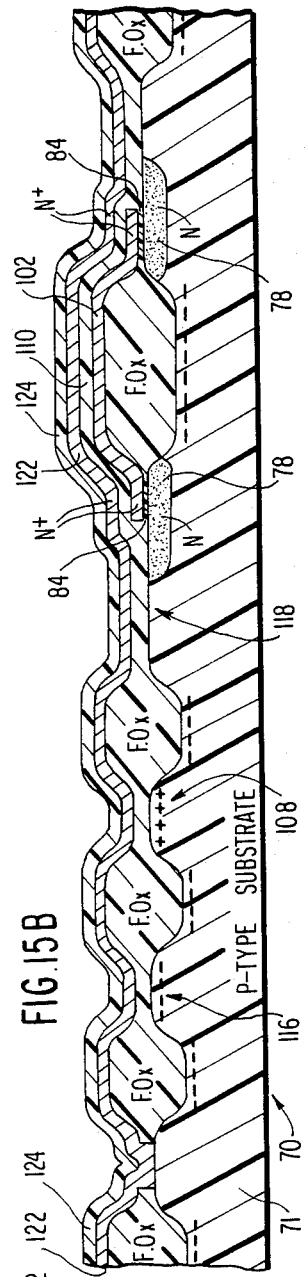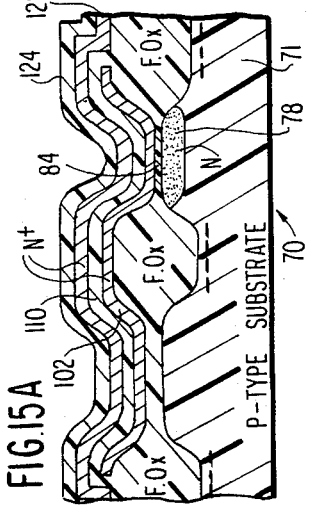

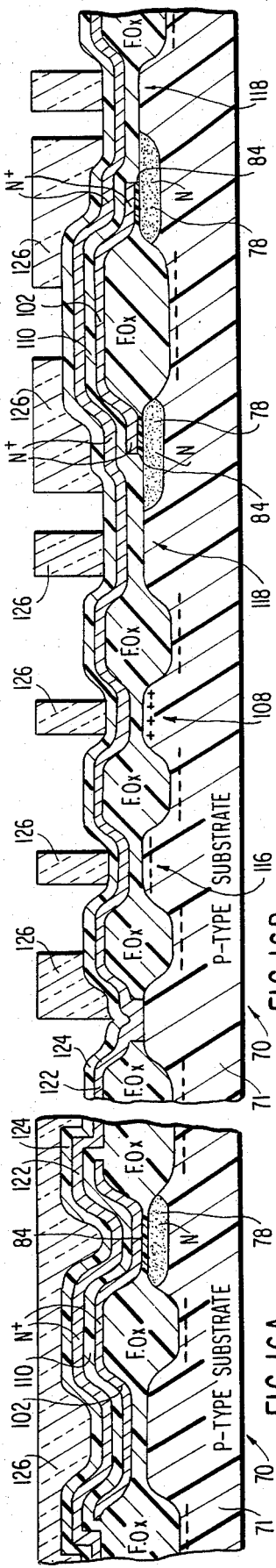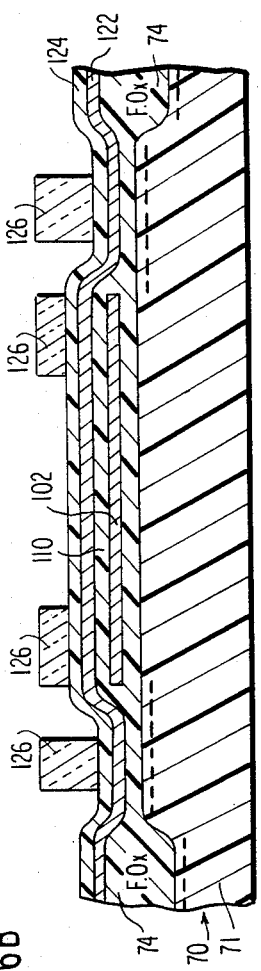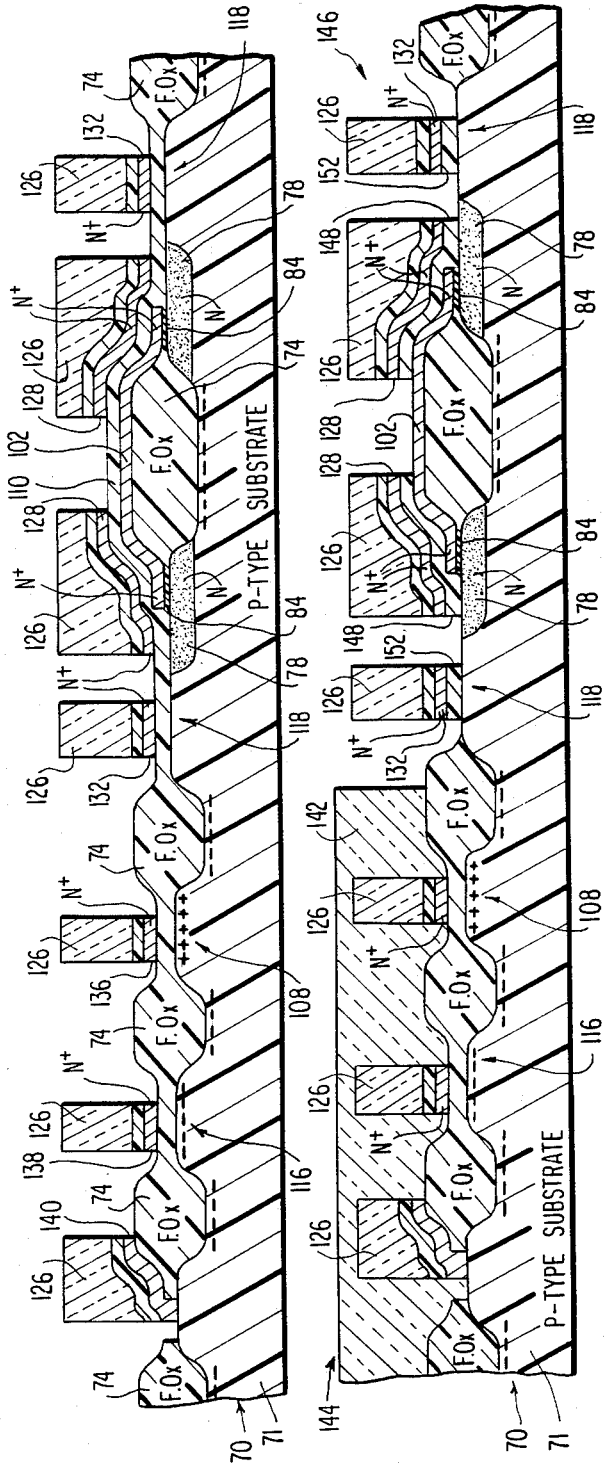

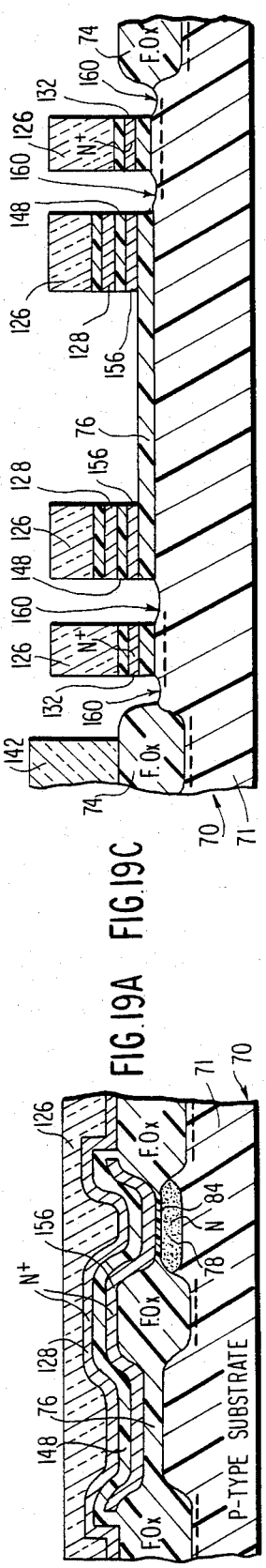
FIG.19A  FIG.19C
FIG.19B
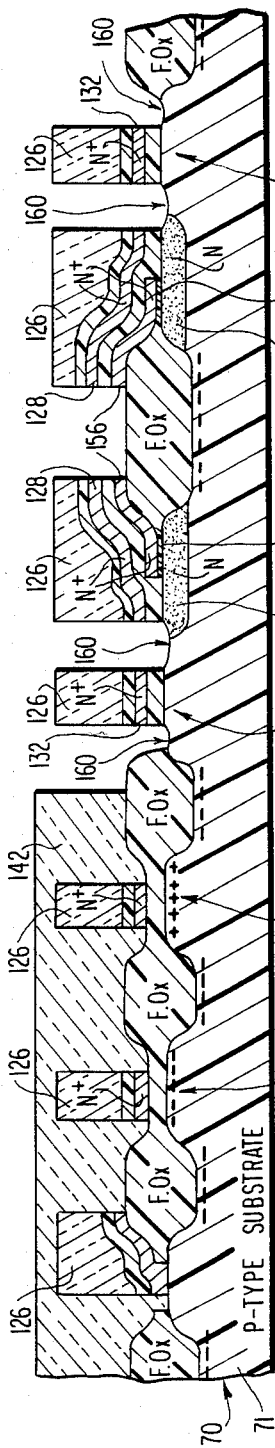
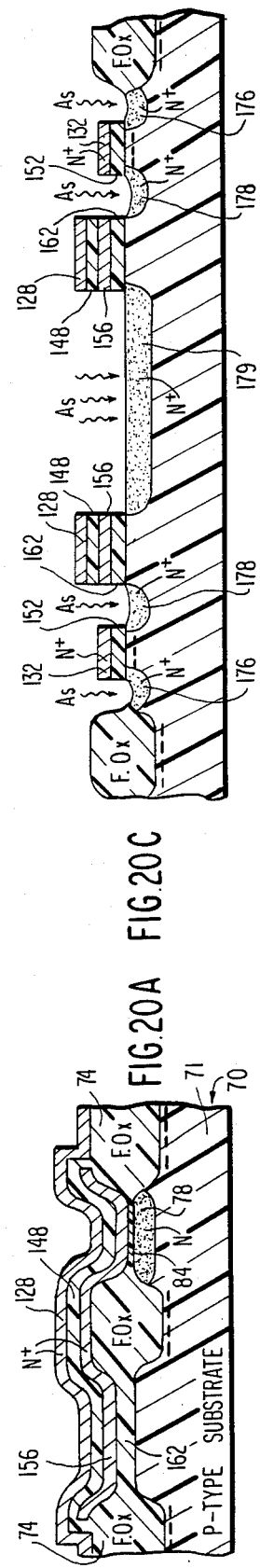
FIG.20A  FIG.20C
FIG.20B
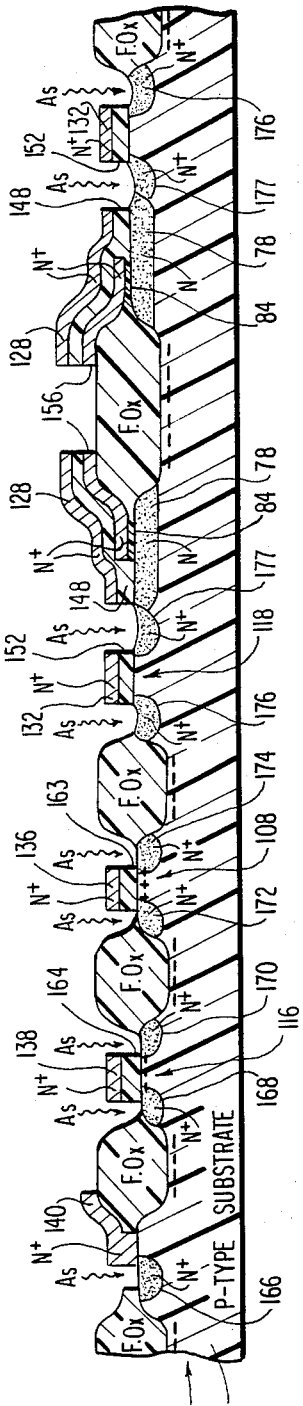

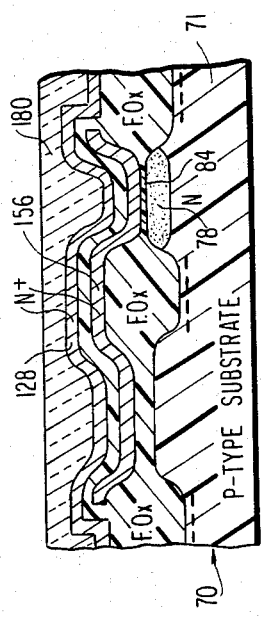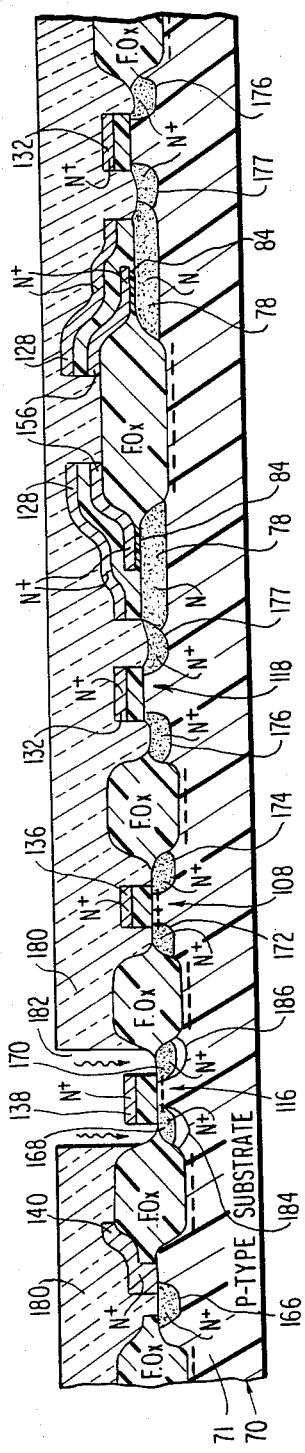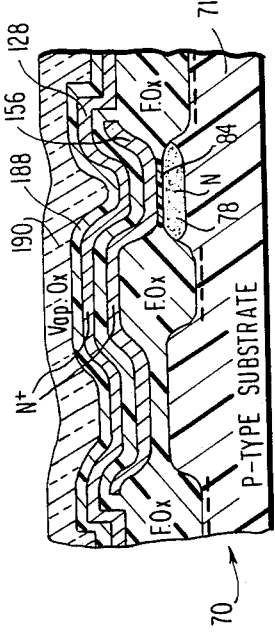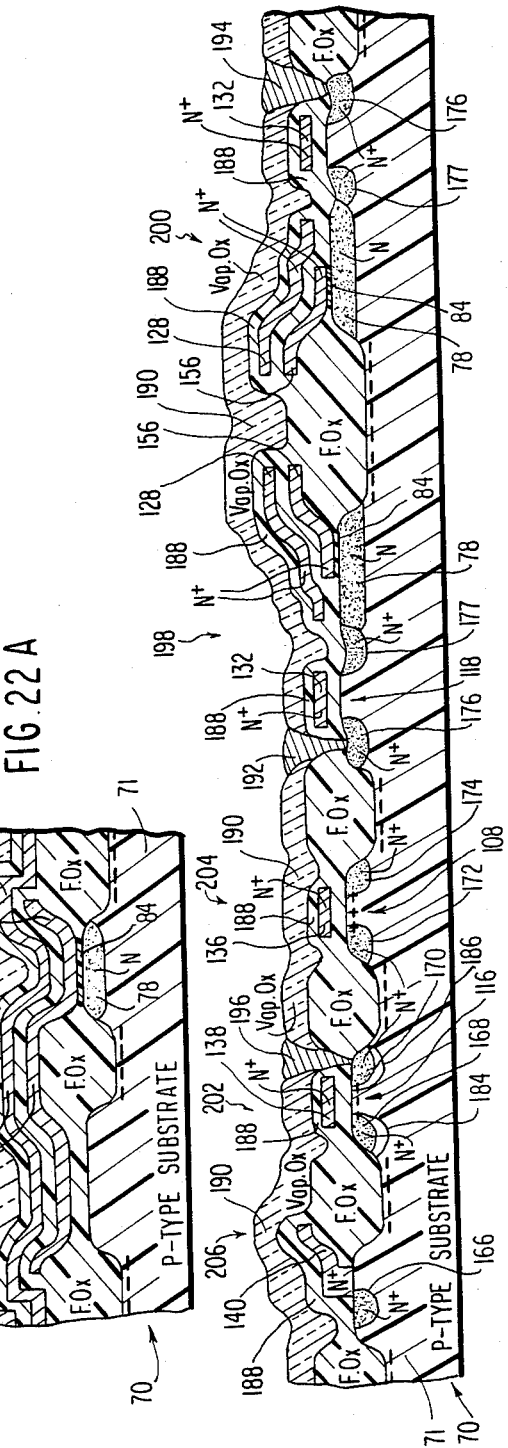

METHOD OF FABRICATING AN MOS MEMORY ARRAY HAVING ELECTRICALLY-PROGRAMMABLE AND ELECTRICALLY-ERASABLE STORAGE DEVICES INCORPORATED THEREIN

TECHNICAL FIELD

The present invention relates generally to a method for fabricating an MOS memory array and is more specifically directed to a method for fabricating a memory array including steps for forming electrically-programmable and electrically-erasable memory cell storage devices, memory cell selection devices and assorted peripheral devices on a semiconductor substrate.

BACKGROUND ART

Recent advances in MOS technology, and in particular the development of practical solutions to the problems associated with the construction of thin tunnel dielectrics, have led to the successful design and manufacture of non-volatile memory cells having both electrical programming and electrical erasing capabilities. U.S. Pat. No. 4,115,914 issued to Harari on Sept. 26, 1978; U.S. Pat. No. 4,203,158 issued to Frohman-Bentchkowsky et al on May 13, 1980 and co-pending application Ser. No. 343,847, filed Jan. 29, 1982 and assigned to the assignee of the present invention, for example, all disclose semiconductor storage devices adapted for use in an MOS memory cell, wherein the storage devices employ thin tunnel dielectrics to facilitate electrical programming and electrical erasing of the cell. The structures of both the Harari and Frohman-Bentchkowsky et al storage devices include a floating gate disposed above the surface of a substrate and insulated therefrom by an oxide layer. The major portion of the oxide layer is relatively thick, i.e., 500 A to 1,000 A, but a remaining portion of the oxide comprises a thin tunnel dielectric on the order of 20A to 200A which separates the floating gate from an active substrate region contiguous with the storage device source, drain or channel region. When a suitable unipolar potential is applied to a control gate vertically-aligned with the floating gate, charge carriers can be tunneled from the active substrate region through the thin dielectric to the floating gate. Similarly, application of another unipolar potential to the active substrate region causes charge carriers present on the floating gate to tunnel back out of the floating gate through the thin tunnel dielectric and into the active substrate region.

In addition to disclosing the structure and operation of electrically-programmable and electrically-erasable storage devices, the aforementioned Harari and Frohman-Bentchkowsky et al patents teach a series of process flow steps whereby the storage devices are formed. For the most part, these process flow steps are conventional in nature, merely involving a collection of known MOS fabrication techniques arranged in a predetermined sequence calculated to yield the desired storage device configuration. Where, however, storage device components are fundamentally rearranged for the purpose of improving memory cell programming and erasing performance as disclosed in the aforementioned co-pending application Ser. No. 343,847, the prior art teachings associated with prior art configurations provide little guidance in establishing a sequence of process flow steps appropriate to the new and improved storage device configurations.

DISCLOSURE OF THE INVENTION

It is accordingly an object of the present invention to provide a method for fabricating an MOS memory cell having an electrically-programmable and electrically-erasable storage device incorporated therein.

It is another object of the present invention to provide a method for fabricating an MOS memory cell including the steps of constructing an electrically-programmable and electrically-erasable storage device in combination with a memory cell selection device.

It is yet another object of the present invention to provide a method for fabricating an MOS memory cell, which memory cell employs an electrically-programmable and electrically-erasable storage device having a floating gate structure separated from a substrate tunneling region by a thin tunnel dielectric.

It is a further object of the present invention to provide a method for fabricating an MOS memory cell, which memory cell includes a storage device having a thin tunnel dielectric formed from a material characteristically exhibiting a low potential barrier to the transport of charge carriers therethrough.

It is still a further object of the present invention to provide a method for fabricating an MOS memory cell including the steps of constructing a memory cell storage device having vertically-aligned doped polycrystalline silicon gates insulated from one another by an interpoly oxide grown in a manner such that out-diffusion of dopant from the lower doped polycrystalline silicon gate is prevented.

It is an object of the present invention to provide a method for fabricating an MOS memory array wherein the memory array includes paired, mirror-image memory cells having storage devices and selection devices electrically connectable to peripheral devices, at least some of which peripheral devices are formed with high breakdown voltages.

These and other objects of the present invention are achieved by a method of fabricating MOS memory cells on a semiconductor substrate, the method resulting in the construction of memory cell storage devices which may be electrically programmed and electrically erased. Memory cell selection devices and selected peripheral devices may be constructed together with the memory cell storage devices. The method includes the steps of forming gate oxides over active channel regions associated with each storage device, implanting impurities in the semiconductor substrate to define a substrate tunneling region for each storage device, and then growing an oxide layer of 50 A to 150 A over the tunneling region to define a thin tunnel dielectric for each storage device. All of the thin tunnel dielectrics so defined are preferably annealed in ammonia, whereupon at least a portion of the oxide in the thin tunnel dielectrics is converted to an oxynitride material which exhibits a relatively low potential barrier to charge carriers tunneling through the dielectrics. A first conductive layer of doped polycrystalline silicon is deposited over the gate oxides and thin tunnel dielectrics and etched to define large polysilicon areas. An intermediate oxide layer is grown over the large polysilicon areas as well as the remainder of the substrate during a two-temperature baking process which "caps" the large polysilicon areas to prevent out-diffusion of the impurity present therein. A second conductive layer of polycrystalline silicon is subsequently deposited over the intermediate oxide layer. Using a first photoresist mask, the second conductive layer is etched to provide program gates for the memory cell storage devices and control gates for the memory cell selection devices and peripheral devices. Exposed areas of the intermediate oxide layer are then etched away in alignment with the first photoresist mask to define the interpoly oxides for the memory cell storage devices and the gate oxides for the memory cell selection devices. Those portions of the large polysilicon areas uncovered by the etch of the intermediate oxide layer are also removed via etching techniques, whereupon the remaining portions of the large polysilicon areas define floating gates for the memory cell storage devices. A second photoresist mask may, if desired, be employed during the etching of the large polysilicon areas to protect the surface of the substrate surrounding the peripheral devices from damage. Alternately, the substrate surface may be protected from damage by performing the large polysilicon area etch with an etching technique which discriminates between the doped polycrystalline silicon material in the large polysilicon areas and the undoped silicon substrate. An oxide dip-out is performed on the portions of the initial oxide layer uncovered during the large polysilicon area etch to define gate oxides for the storage devices. The oxide dipout additionally removes the remaining exposed portions of the intermediate oxide layer to define the peripheral device gate oxides. An impurity is thereafter implanted in the substrate to form self-aligned source and drain regions for the memory cell storage and selection devices and the peripheral devices. A high voltage phosphorous implant at the source and drain regions of selected peripheral devices may be used to increase the breakdown voltage of the selected peripheral devices. Finally, various oxidation and contact metallization steps are carried out to complete the fabrication of the memory cell.

BRIEF DESCRIPTION OF THE DRAWINGS

The various features, objects and advantages of the present invention will become more apparent upon consideration of the following Brief Description of the Drawings and Best Mode for Carrying Out the Invention, wherein:

The remaining figures provide cross-sectional views of the various steps involved in fabricating an MOS memory array. The memory array includes the paired, mirror-image memory cells of FIG. 2 together with representative peripheral devices. Those cross-sectional views having an A designator affixed thereto are taken along line A—A of FIG. 2, while those cross-sectional views having B and C designators affixed thereto are respectively taken along lines B—B and C—C of FIG. 2. More particularly, FIGS. 3A, 3B, and 4A–4C illustrate the front-end processing steps of the present invention;

FIGS. 5A and 5B depict the formation of the storage device tunneling regions;

FIGS. 6A and 6B illustrate the steps of forming the storage device tunnel dielectrics;

FIG. 7 is a close-up view of one of the tunnel dielectrics formed in FIGS. 6A and 6B;

FIGS. 8A–8C illustrate steps for depositing a first polycrystalline silicon layer over the surface of the memory array substrate;

FIGS. 9A and 9B depict a method for etching the first polycrystalline silicon layer to define large polysilicon areas;

FIGS. 10A–10C, 11A and 11B illustrate the processing steps involved in preparing channel regions for peripheral depletion-mode devices;

FIGS. 12A and 12B depict the growth of an intermediate oxide layer over the surface of the memory array sub- strate;

FIGS. 13A–13C illustrate the processing steps involved in preparing channel regions for peripheral enhancement-mode devices;

FIGS. 14A and 14B show the processing steps utilized to etch the intermediate oxide layer in preparation for the formation of buried contact regions;

FIGS. 15A and 15B depict the step of depositing a second polycrystalline silicon layer over the intermediate oxide layer;

FIGS. 16A–16C, 17, 18, and 19A–19C illustrate the processing steps involved in etching the second polycrystalline silicon layer, the large polysilicon areas, and the intermediate oxide layer to define various control, program and floating gates;

FIGS. 20A–20C depict the source/drain implant step whereby self-aligned source and/or drain regions are created using the various peripheral and memory cell selection device control gates and the memory cell storage device program gates as masks;

FIGS. 21A and 21B illustrate a high voltage phosphorous implant step designed to increase the breakdown voltage of selected peripheral devices; and FIGS. 22A and 22B depict the oxidation and metallization steps employed to complete the fabrication of the memory array.

BEST MODE FOR CARRYING OUT THE INVENTION

Figure 1:
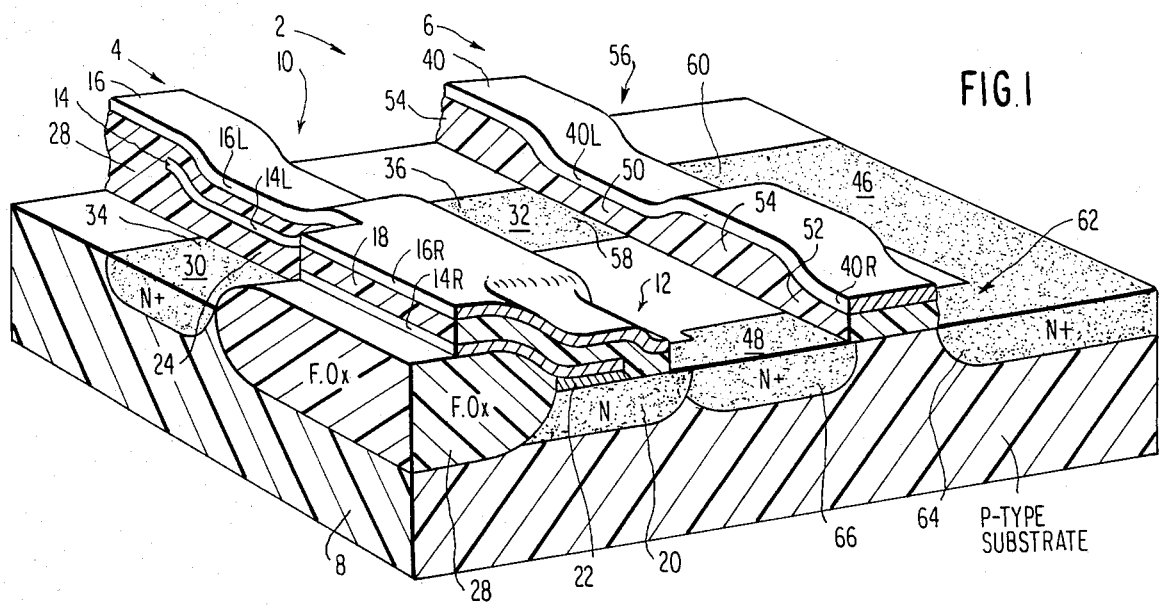
FIG. 1 is a perspective cross-section of a single memory cell constructed in accordance with the present invention, showing both the memory cell storage device and the memory cell selection device.
Figure 2:
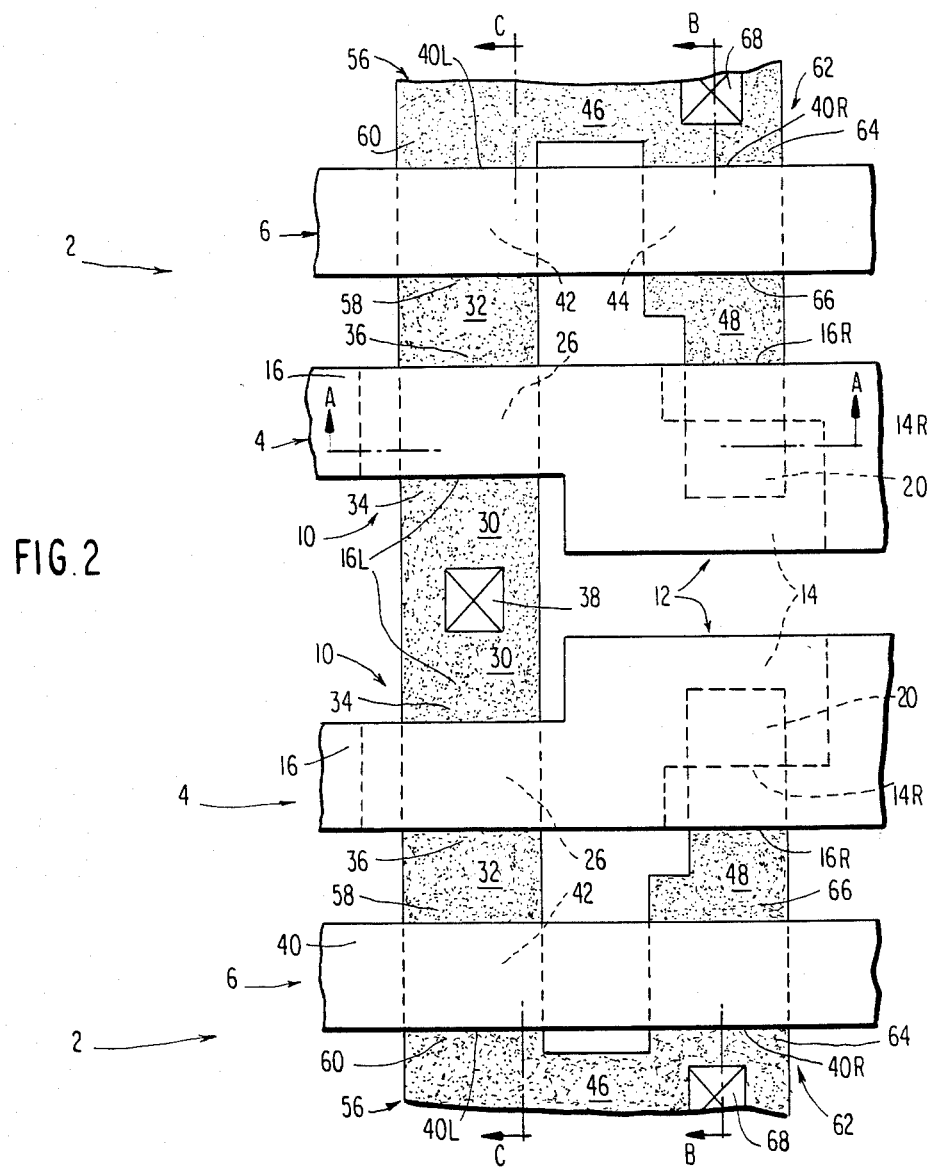
FIG. 2 is a top view of a pair of memory cells formed in mirror-image fashion.

The method of the present invention is utilized to fabricate an MOS memory array having one or more memory cells 2 such as those illustrated in FIGS. 1 and 2. FIG. 1 specifically provides a perspective cross-sectional view of a single memory cell, and FIG. 2 shows a preferred layout for a pair of mirror-image memory cells, each of which memory cells is identical to the memory cell 2 of FIG. 1. Memory cell 2 comprises a storage device 4 and a sensing device 6 both constructed on a p-type substrate 8 of monocrystalline silicon or the like. Storage device 4 is an electrically programmable and electrically-erasable semiconductor structure divided into sensing and programming sections 10 and 12. The storage device includes first and second electrically conductive strips 14 and 16 separated by an interpoly oxide 18. The programming section 12 of storage device 4 includes a floating gate portion 14R of first conductive strip 14 and a program gate portion 16R of second conductive strip 16 disposed over an active tunneling region 20 in the substrate such that floating gate portion 14R is separated from tunneling region 20 by a thin tunnel dielectric 22 formed from silicon dioxide/oxynitride ($SiO_2$-$Si_xO_yN_z$) material. When a suitable potential is applied to the program gate portion 16R of second conductive strip 16, charge carriers are tunneled from the substrate tunneling region 20 through thin tunnel dielectric 22 to the floating gate portion 14R of first conductive strip 14. Similarly, the application of a suitable potential to the tunneling region, which potential is of the same polarity as the potential applied to program gate portion 16R during programming operations, causes charge carriers to tunnel back from the floating gate portion 14R through the thin tunnel dielectric into the tunneling region. The sensing section 12 of storage device 4 is formed by extending the first and second conductive strips 14, 16 from programming section 12 over the surface of substrate 8 to a gate oxide 24 positioned above an active channel region 26 such that floating gate portion 14L of first conductive strip 14 and program gate portion 16L of second conductive strip 16 are vertically aligned with gate oxide 24. Field oxides 28 separate first conductive strip 14 from the surface of substrate 8 intermediate the thin tunnel dielectric and the gate oxide. Active channel region 26 is bounded by diffusions 30 and 32 formed from a material having a conductivity-type opposite to that of substrate 8, i.e., a n-type material, whereupon diffusion 30 and the portion of diffusion 32 abutting active channel region 26 respectively define sensing section source/drain regions 34 and 36. A memory cell read line (not shown) is connected to diffusion 30 via a metal contact 38. During read operations, an indication of the presence or absence of charge carriers in first conductive strip 14 can be obtained by sensing the amount of current flow across active channel region 26 in response to reference potentials applied through metal contact 38 to source/drain region 34 and through second conductive strip 16 to program gate portion 16L.

The selection device 6 of memory cell 2 includes a third conductive strip 40 extending across an active enhancement-type channel region 42 and an active zero threshold voltage channel region 44 respectively bounded by n-type diffusions 32, 46 and 46, 48. Gate oxides 50 and 52 respectively separate control gate portions 40L and 40R of third conductive strip 40 from channel regions 42 and 44, while field oxides 54 are interposed between the remainder of third conductive strip 40 and substrate 8. It can thus be seen that control gate portion 40L together with gate oxide 50 and channel region 42 function as a first or enhancement mode field effect transistor structure 56 for establishing a conductive path between source/drain regions 58, 60 respectively defined by those portions of diffusions 32 and 46 abutting channel region 42, whereas control gate portion 40R together with gate oxide 52 and active channel region 44 form a second or zero threshold voltage field effect transistor structure 62 for establishing a conductive path between source/drain regions 64, 66 respectively defined by those portions of diffusions 46 and 48 abutting channel region 44. A memory cell write line (not shown) is connected to diffusion 46 via metal contact 68. Upon application of a suitable potential to third conductive strip 40, the potential present on the memory cell write line is simultaneously transferred from metal contact 68 to the sensing section source/drain region 36 and, through diffusion 48, to tunneling region 20. The ability to simultaneously transfer write line potentials to source/drain region 36 and tunneling region 20 permits temporary grounding of the tunneling region as well as the source/drain region 36 during memory cell read operations. Grounding of the tunneling region in turn prevents read disturb conditions from occurring in the thin tunnel dielectric 22 as memory cell 2 is being read. Moreover, the need for establishing a direct ground line or diffusion at the source/drain region 34 of storage device sensing section 10 is avoided and the bias of the sensing section can be reversed as desired, permitting the potential at source/drain region 34 to float during memory cell erase operations and eliminating any direct current path to ground through sensing section channel region 26. As a result, the memory cell 2 is more compatible with low current power supplies. The zero threshold voltage characteristic of second field effect transistor structure 62 in selection device 6 also enables the transfer of the true or full value of the write line potential to the tunneling region 20 during memory cell program and erase operations, whereby more efficient programming of the memory cell may be achieved. A more detailed explanation of the construction and operating advantages of memory cell 2 can be found in co-pending application Ser. No. 343,847 filed on Jan. 29, 1982, the teachings of which are incorporated herein by reference.

The fabrication of a memory array incorporating the paired memory cells of FIG. 2 will now be described. The memory array, which, for purposes of convenience, is only partially illustrated in the Figures to follow, includes various peripheral devices integrally constructed with the paired memory cells on a semiconductor slice 70. The substrate 71 of semiconductor slice 70 is a p-type substrate comprised of monocrystalline silicon or the like. As shown in FIGS. 3A, 3B, and 4A–4C, known "front-end" processing steps are employed in forming field implants 72 and field oxide growths 74 at selected sites on the substrate. Thereafter, an initial oxide layer 76 is thermally grown to a thickness of 650 Å in the areas between the field oxides 74. Turning to FIGS. 5A and 5B, the tunneling regions 78 associated with the memory cells are established by depositing a layer of photoresist 80 on semiconductor slice 70 and employing a masking step to define openings 82 in the photoresist layer 80 over the desired tunneling region locations. An oxide etch is performed to remove the portions of initial oxide layer 76 uncovered by openings 82, thus exposing selected areas of substrate 71, and an n-type impurity such as arsenic is implanted in the exposed substrate to form the tunneling regions 78. Next, as indicated in FIGS. 6A and 6B, photoresist layer 80 is stripped and a dielectric film 84 of silicon dioxide having a thickness of approximately 120Å is thermally grown over tunneling regions 78. Dielectric film 84 serves as the thin tunnel dielectric for the programming sections of the memory cell storage devices.

When an appropriate voltage is applied to the program gate portion of an individual storage device programming section, electrons are transported via a tunneling mechanism from the programming section tunneling region through the thin tunnel dielectric to the programming section floating gate portion of the storage device. Similarly, when an appropriate potential is applied to the tunneling region, electrons are removed from the programming section floating gate portion via a tunneling mechanism and are returned back through the thin tunnel dielectric to the tunneling region. Silicon dioxide in its pure state normally presents a relatively high potential barrier to the transport of charge carriers such as electrons. In order to decrease this potential barrier in the storage device of the present invention, dielectric film 84 may be annealed at a temperature between 900° C. and 1200° C. in an ammonia-containing gaseous mixture following the thermal oxide growing step. The annealing process converts the pure silicon dioxide of the dielectric film to a silicon dioxide/oxynitride ($SiO_2$-$Si_xO_yN_z$) material. Because the potential barrier of silicon oxynitride to electron transport is lower than that of silicon dioxide, the use of silicon oxynitride in the thin tunneling dielectric will enhance the program and erase capabilities of the storage device programming section. As can be seen in FIG. 7, annealing of the dielectric film 84 in an ammonia-containing gaseous medium actually results in the formation of a striated structure comprising a center layer 86 of silicon dioxide covered by upper and lower layers of silicon oxynitride, respectively designated at 88 and 90. It is thought that during the annealing process, nitrogen passes through the dielectric film 84 to the silicon dioxide-silicon interface at the surface 92 of substrate 71, thereby establishing the lower silicon oxynitride layer 90. Meanwhile, the upper silicon oxynitride layer 88 is formed by a nitrogen-to-oxygen replacement mechanism. FIG. 7, upon closer examination, reveals that the upper silicon oxynitride layer is relatively thinner than the lower silicon oxynitride layer. Hence, electrons tunneling from the floating gate portion of the storage device programming section to the tunneling region 78 will encounter a greater potential barrier problem upon reaching center silicon dioxide layer 86 than those electrons which tunnel from the tunneling region to the floating gate portion. This problem can be overcome by increasing the thickness of upper silicon oxynitride layer 88 with an additional silicon oxynitride layer, indicated in phantom at 94 in FIG. 7, following the tunnel dielectric annealing step. Additional silicon oxynitride layer 94 may be formed using either deposition or sputter techniques.

When the formation of the dielectric films 84 is complete, a first layer of polycrystalline silicon 96 is deposited on the semiconductor slice 70 as indicated in FIGS. 8A-8C and is appropriately doped with phosphorous to establish a polycrystalline silicon sheet resistance of 20Ω per square. The phosphorous doping may be carried out during the actual polycrystalline silicon deposition process or may be performed by standard diffusion or ion implantation steps occurring after deposition of the first polycrystalline silicon layer has been completed. An oxide layer 98 is thermally grown over first polycrystalline silicon layer 96 to provide a suitable surface for receiving photoresist material. Photomasking techniques are subsequently used to deposit a mask 100 of photoresist material in preparation for isolating those portions of the first polycrystalline silicon layer 96 associated with each mirror-image pair of memory cells. Turning to FIGS. 9A and 9B, oxide layer 98 and first polycrystalline silicon layer 96 are etched in alignment with photoresist mask 100 to define large polysilicon areas 102. As depicted in FIGS. 10A-10C, photoresist mask 100 is then stripped and an oxide dip-out process performed, whereby the portions of oxide layer 98 present on large polysilicon areas 102 as well as those portions of initial oxide layer 76 exposed by the etching of first polycrystalline layer 96 are removed. The portions of initial oxide layer 76 lying beneath the large polysilicon areas, seen to best advantage in FIG. 10C, remain intact in preparation for establishing the gate oxides of the storage device sensing sections.

FIGS. 11A and 11B illustrate the steps taken to prepare substrate 71 for the fabrication of depletion mode peripheral devices. More specifically, photomasking techniques are employed to deposit a mask 104 of photoresist material over the semiconductor slice 70. Mask 104 contains openings 106 over the substrate areas which are to support depletion mode devices. An n-type impurity such as arsenic (As) is then implanted into the substrate areas exposed by openings 106 to create depletion regions 108. It should be noted at this point that if the depletion impurity were to be implanted prior to the annealing step used during the formation of the thin tunnel dielectric 84 disclosed in connection with FIGS. 6A and 6B, the relatively high temperatures necessary to carry out the annealing process would tend to drive the n-type impurity further into substrate 71. By performing the depletion implant after the thin tunnel dielectric has been annealed, however, such redistribution of the diffusion impurity can be avoided and greater control over the threshold voltage of the depletion mode peripheral devices can be exercised.

Following the depletion implant, photoresist mask 104 is stripped and an intermediate oxide layer 110 having a thickness of 650 A is thermally grown over the entire surface of semiconductor slice 70. During the initial soak or thermal equalization cycle of this growth process, oxidation is carried out at a temperature of 800° C. in an environment which basically comprises oxygen and gaseous hydrochloride (HCl), producing an oxide of approximately 100 A in thickness. After a predetermined interval, the oxidation temperature is ramped up to 1,070° C. for an additional period of time to form the remaining 550 A of intermediate oxide layer 110. Inasmuch as oxides grown on doped polycrystalline silicon under relatively low temperature conditions increase in thickness at a rate faster than the rate of impurity outdiffusion from the doped polycrystalline silicon, the portion of the intermediate oxide layer 110 formed at 800° C. essentially "caps" large polysilicon area 102, preventing phosphorous out-diffusion from the large polysilicon area to peripheral areas. The high temperature oxide growth cycle of the present invention, on the other hand, imparts desirable qualities such as high breakdown voltage, low surface charge and low mobile ion contamination to intermediate oxide layer 110.

Substrate 71 is prepared for the fabrication of enhancement mode devices by employing photomasking techniques to form a mask of photoresist material, indicated at 112 in FIGS. 13A and 13B, having openings 114 disposed therein for the purpose of defining peripheral device enhancement regions 116. Photoresist mask 112 also contains openings 117 positioned as shown in FIG. 13C over those areas of the substrate on which the first field effect transistor structures of the memory cell selection devices will be fabricated. An enhancement implant using boron or the like is next carried out through the intermediate oxide layer 110, whereby the threshold voltages of the various enhancement mode peripheral devices and the first field effect transistor structures may be adjusted. Regions 118 in substrate 71 receive no implant and are consequently left in a virgin condition to provide zero threshold voltage characteristics for the second field effect transistor structures of the memory cell selection devices. Photoresist mask 112 is thereafter stripped and another mask 119 also comprised of photoresist material is formed using the standard photomasking techniques depicted in FIGS. 14A and 14B. Photoresist mask 119 contains openings 120 positioned over the desired location of buried contact regions in substrate 71, and those portions of intermediate oxide layer 110 uncovered by openings 120 are etched away to expose substrate 71.

Turning to FIGS. 15A and 15B, a second polycrystalline silicon layer 122 is deposited on semiconductor slice 70 and oxidized to form an outer oxide layer 124. Second polycrystalline silicon layer 122 is doped with an n-type impurity such as phosphorous, and this doping may likewise be carried out during the actual polysilicon deposition process or may be performed by standard ion implantation or impurity diffusion steps occurring between the second polycrystalline silicon layer deposition and the outer oxide layer growth steps. A mask 126 composed of photoresist material is laid down over the semiconductor slice using photomasking techniques, as illustrated in FIGS. 16A-16C. Outer oxide layer 124 and second polycrystalline silicon layer 122 are then etched in accordance with the pattern of photoresist mask 126 to define storage device program gates 128, selection device control gates 132, depletion device control gates 136, enhancement device control gates 138, and buried contacts 140 as illustrated in FIG. 17. Storage device program gates 128 correspond to the second conductive strips 14 in FIG. 2 while selection device control gates 132 correspond to the third conductive strips 40 in FIG. 2.

In FIG. 18, a second photoresist mask 142 is laid down over the peripheral areas 144 of semiconductor slice 70, covering those segments of photoresist mask 126 located in the peripheral areas. The purpose of second photoresist mask 142, as will be described shortly, is to protect the areas of substrate 71 surrounding the peripheral devices from damage otherwise occurring during etching of the large polysilicon area 102. With second photoresist mask 142 in place, the exposed portions of intermediate oxide layer 110 in the memory cell areas 146 of the semiconductor slice are etched away in alignment with storage device program gates 128 and selection device control gates 132, using photoresist mask 126 as a guide. The remaining portions of intermediate oxide layer 110 disposed between large polysilicon area 102 and program gates 128 define the interpoly oxides 148 for the memory cell storage devices, whereas the remaining portions of intermediate oxide layer 110 disposed beneath control gates 132 function as gate oxides 152 for the memory cell selection devices.

As seen in FIGS. 19A-19C, the exposed portions of the large polysilicon area 102 are next etched away to define the storage device floating gates 156, using the structures comprised of interpoly oxides 148, program gates 128, outer oxide layer 124 and photoresist mask 126 for alignment. It is evident that the presence of second photoresist mask 142 in the peripheral areas 144 of substrate slice 70 protects the substrate areas surrounding the peripheral devices from both the etchant which removes exposed portions of intermediate oxide layer 110 and the etchant which removes exposed portions of large polysilicon area 102 in the memory cell areas 146 of the semiconductor slice. However, some damage does occur to areas 160 of substrate 71 exposed after intermediate oxide layer 110 has been etched. This damage is generally slight, and does not affect the performance of the individual memory cells. Nevertheless, in an alternative embodiment of the present invention, damage to substrate 71 during the large polysilicon area etch can be avoided entirely by employing an etchant such as freon 13 which discriminates between doped and undoped polycrystalline silicon. In this manner, large polysilicon area 102 can be etched to define floating gates 156 while exposed portions 160 of substrate 71 remain unaffected by the discriminant etchant. Where such a discriminant etchant is employed, of course, second photoresist mask 142 may be eliminated.

Upon completion of the floating gate etch, photoresist masks 126 and 142 are stripped and the remaining portions of outer oxide layer 124 as well as the now-exposed portions of the initial oxide layer 76 in the memory cell area of the semiconductor slice and the intermediate oxide layer 110 in the peripheral areas of the semiconductor slice are etched away to form the configuration illustrated in FIGS. 20A-20C. Those portions of initial oxide layer 76 left beneath floating gate 156 in the memory cell areas define gate oxides 162 for the storage device sensing sections. Those portions of intermediate oxide layer 110 left beneath control gates 136 and 138 in the peripheral areas define respective gate oxides 163 and 164 for the peripheral devices. An n-type impurity such as arsenic is implanted into the various exposed areas of substrate 71 to form n-type diffusions aligned with the various program and control gates and the buried contacts. In particular, n-type diffusion 166 serves as a buried contact region, diffusions 168 and 170 respectively serve as enhancement mode device source and drain regions, diffusions 172 and 174 respectively serve as depletion device source and drain regions, and diffusions 176, 177, 178 and 179 respectively serve as source/drain regions for the second field effect transistor structures. Note also that diffusions 177 provide conductive paths between tunneling regions 78 and channel regions 117. If desired, a mask composed of photoresist material, indicated at 180 in FIGS. 21A and 21B, may be laid over the semiconductor slice, covering the memory cells and all but a selected few of the peripheral devices. Openings 182 in photoresist mask 180 over the selected peripheral devices expose substrate 71 to a high voltage phosphorous implant, e.g., a phosphorous implant at 50-150 kev, permitting the formation of deep impurity regions such as 184 and 186 at the selected peripheral device sites. The double diffusions thereby created, such as the deep impurity regions 184 and 186 respectively underlying enhancement mode device source and drain regions 168 and 170, increase the breakdown voltage of the selected peripheral devices in turn rendering the selected peripheral devices more suitable for use in higher density memory arrays where shallow source and drain diffusions are required.

Subsequent to the high voltage phosphorous implant of FIGS. 21A and 21B, photoresist mask 180 is stripped away. As indicated in FIGS. 22A and 22B, a final or refill dry oxide layer 188 of approximately 1,000 A in thickness is then regrown over the entire semiconductor slice and a protective VapOx layer 190 is coated over the refill oxide layer 188. The semiconductor slice is completed by employing several known steps including contact formation steps wherein metal contacts such as 192, 194 and 196 are positioned in predetermined patterns on the semiconductor slice. A semiconductor memory array including a memory cell area having individual memory cells 198 and 200 in combination with a peripheral area having enhancement mode devices 202, depletion mode devices 204 and buried contact areas 206 is thus fabricated in an integral fashion.

The present invention has been set forth in the form of one preferred embodiment. It is nevertheless understood that modifications to the method of fabricating an MOS memory array disclosed herein may be made by those skilled in the art without departing from the scope and spirit of the present invention. Moreover, such modifications are considered to be within the purview of the appended claims.

I claim:

1. A method of constructing a tunnel dielectric for an MOS device such that charge carriers supplied by an active region in the device can be transported through said tunnel dielectric, said method comprising the steps of:
   forming an oxide layer over the active region to provide said tunnel dielectric; and
   converting at least a portion of said oxide layer to an oxynitride material, said oxynitride material exhibiting a relatively low potential barrier to charge carriers tunnelling therethrough.

2. The method as set forth in claim 1, wherein said step of converting at least a portion of said oxide layer to said oxynitride material includes the further step of annealing said oxide layer in an ammonia-containing gas.

3. A method as set forth in claim 2, wherein said step of annealing said oxide layer in an ammonia-containing gas is carried out at a temperature between 900° C. and 1200° C.

4. A method as set forth in claim 1, wherein the active region of the device is formed in the device substrate and said step of forming an oxide layer over the active region includes the step of thermally growing said oxide layer on the surface of the device substrate.

5. A method as set forth in claim 4, wherein the device substrate is comprised of silicon and said oxide layer is comprised of silicon dioxide.

6. A method as set forth in claim 5, wherein said oxynitride material is comprised of silicon oxynitride.

7. A method as set forth in claim 1, wherein said oxide layer has a thickness between 50 Å and 150 Å.

8. A method as set forth in claim 1 including the further step of forming an additional layer of oxynitride material over said oxide layer following said step of converting at least a portion of said oxide layer to said oxynitride material.

9. A method as set forth in claim 1, including the further step of depositing a layer of electrically-conductive material over said oxide layer following said step of converting at least a portion of said oxide layer to said oxynitride material.

10. A method of forming an interpoly oxide layer of predetermined thickness on a first semiconductor gate in an MOS device fabricated on a substrate such that said interpoly oxide layer exhibits high breakdown voltages, low surface charge states and low mobile ion contamination, said method comprising the steps of:
    thermally growing an oxide layer over the first semiconductor gate in an atmosphere containing oxygen and gaseous hydrochloride at a temperature of approximately 800° C. until the thickness of said oxide layer reaches approximately 100 Å.; and
    continuing to grow said oxide layer in an atmosphere containing oxygen and gaseous hydrochloride at a temperature of at least approximately 1,000° C. until said oxide layer reaches the predetermined thickness.

11. A method as set forth in claim 10 wherein said first semiconductor gate is fabricated from a layer of doped polycrystalline silicon, said method comprising the further step of depositing a second layer of doped polycrystalline silicon on said oxide layer to form a second semiconductor gate after said oxide layer has reached the predetermined thickness.

* * * * *